United States Patent
Lang et al.

(10) Patent No.: US 8,297,262 B2
(45) Date of Patent: Oct. 30, 2012

(54) FUEL VAPOR STORAGE AND RECOVERY APPARATUS

(75) Inventors: Tobias Lang, Herzberg (DE); Piers Catton, Gosport (GB); Ulrich Karsch, Niederkassel (DE); Tho Truong Huynh, Southhampton (GB)

(73) Assignees: Kautex Textron GmbH & Co. KG, Bonn (DE); MAST Carbon Automotive Ltd., Woking Surrey (GB)

( * ) Notice: Subject to any disclaimer, the term of this patent is extended or adjusted under 35 U.S.C. 154(b) by 0 days.

(21) Appl. No.: 12/964,107

(22) Filed: Dec. 9, 2010

(65) Prior Publication Data

US 2011/0139129 A1    Jun. 16, 2011

Related U.S. Application Data

(63) Continuation of application No. 12/431,673, filed on Apr. 28, 2009, now Pat. No. 8,190,111.

(60) Provisional application No. 61/015,664, filed on Dec. 20, 2007.

(51) Int. Cl.
*F02M 33/02* (2006.01)
(52) U.S. Cl. ......... 123/518; 123/520; 123/543; 123/546
(58) Field of Classification Search .................. 123/516, 123/518, 519, 520; 96/132, 133, 137, 144, 96/149, 152, 154
See application file for complete search history.

(56) References Cited

U.S. PATENT DOCUMENTS

| | | | | |
|---|---|---|---|---|
| 4,279,233 A | | 7/1981 | Tobita et al. | |
| 4,778,495 A | * | 10/1988 | Bishop et al. | 96/141 |
| 4,864,103 A | * | 9/1989 | Bishop et al. | 96/141 |
| 4,986,840 A | | 1/1991 | Mori et al. | |
| 5,054,453 A | * | 10/1991 | Onufer | 123/516 |
| 5,170,765 A | | 12/1992 | Hoshino et al. | |
| 5,355,861 A | | 10/1994 | Arai | |
| 5,377,644 A | | 1/1995 | Krohm | |
| 5,456,236 A | | 10/1995 | Wakashiro et al. | |
| 5,456,237 A | | 10/1995 | Yamazaki et al. | |

(Continued)

FOREIGN PATENT DOCUMENTS

EP    1906001    4/2008

(Continued)

OTHER PUBLICATIONS

International Search Report dated Sep. 22, 2008 in International Patent Application No. PCT/EP2008/000266.

(Continued)

*Primary Examiner* — Thomas Moulis
(74) *Attorney, Agent, or Firm* — Grossman Tucker Perreault & Pfleger, PLLC

(57) ABSTRACT

A fuel vapor storage and recovery apparatus includes a fuel vapor storage canister, said fuel vapor storage canister comprising at least first and second vapor storage compartments filled with an absorbent material, for instance filled with activated carbon, at least a vapor inlet port, an atmospheric vent port and a purge port. Said fuel vapor storage canister defines an air flow path between said vapor inlet port and said atmospheric vent port during shut-off of the internal combustion engine of the vehicle. During purging cycles there is defined an air flow path between said atmospheric vent port and said purge port wherein said first and second vapor storage compartments are arranged in concentric relationship and wherein said first and second vapor storage compartments in flow direction are separated from each other by an air gap diffusion barrier.

18 Claims, 2 Drawing Sheets

U.S. PATENT DOCUMENTS

| | | | |
|---|---|---|---|
| 5,460,136 A | 10/1995 | Yamazaki et al. | |
| 5,632,808 A | 5/1997 | Hara et al. | |
| 5,743,943 A | 4/1998 | Maeda et al. | |
| 5,875,765 A * | 3/1999 | Norton | 123/520 |
| 5,915,364 A | 6/1999 | Katou et al. | |
| 6,098,601 A | 8/2000 | Reddy | |
| 6,230,693 B1 * | 5/2001 | Meiller et al. | 123/519 |
| 6,237,574 B1 | 5/2001 | Jamrog et al. | |
| 6,279,548 B1 * | 8/2001 | Reddy | 123/520 |
| 6,537,354 B2 | 3/2003 | Meiller et al. | |
| 6,551,388 B1 | 4/2003 | Oemcke | |
| 6,689,196 B2 | 2/2004 | Amano et al. | |
| 6,695,896 B2 | 2/2004 | Hara et al. | |
| 6,863,714 B2 * | 3/2005 | De Biasio | 96/132 |
| 6,874,483 B2 | 4/2005 | Zuchara | |
| 6,942,721 B2 | 9/2005 | Oh et al. | |
| 6,955,159 B2 | 10/2005 | Ogawa | |
| 7,047,952 B1 | 5/2006 | Yamauchi et al. | |
| 7,134,426 B2 * | 11/2006 | Uchino et al. | 123/518 |
| 7,214,258 B2 | 5/2007 | Abidi et al. | |
| 7,294,179 B2 | 11/2007 | Kim et al. | |
| 7,305,974 B2 | 12/2007 | Nakano et al. | |
| 7,322,343 B2 | 1/2008 | Yamada et al. | |
| 7,409,946 B2 | 8/2008 | King | |
| 7,472,694 B2 | 1/2009 | King | |
| 7,507,278 B2 | 3/2009 | Makino et al. | |
| 2002/0007826 A1 | 1/2002 | Yamada et al. | |
| 2002/0020398 A1 | 2/2002 | Kimoto et al. | |
| 2002/0078931 A1 | 6/2002 | Makino et al. | |
| 2006/0065251 A1 | 3/2006 | Meiller et al. | |
| 2007/0056954 A1 | 3/2007 | Tennison et al. | |
| 2007/0266997 A1 | 11/2007 | Clontz et al. | |
| 2008/0184973 A1 | 8/2008 | Yamazaki et al. | |

FOREIGN PATENT DOCUMENTS

JP     H0589861     12/1993

OTHER PUBLICATIONS

U.S. Office Action dated May 17, 2010 issued in related U.S. Appl. No. 12/341,673.

* cited by examiner

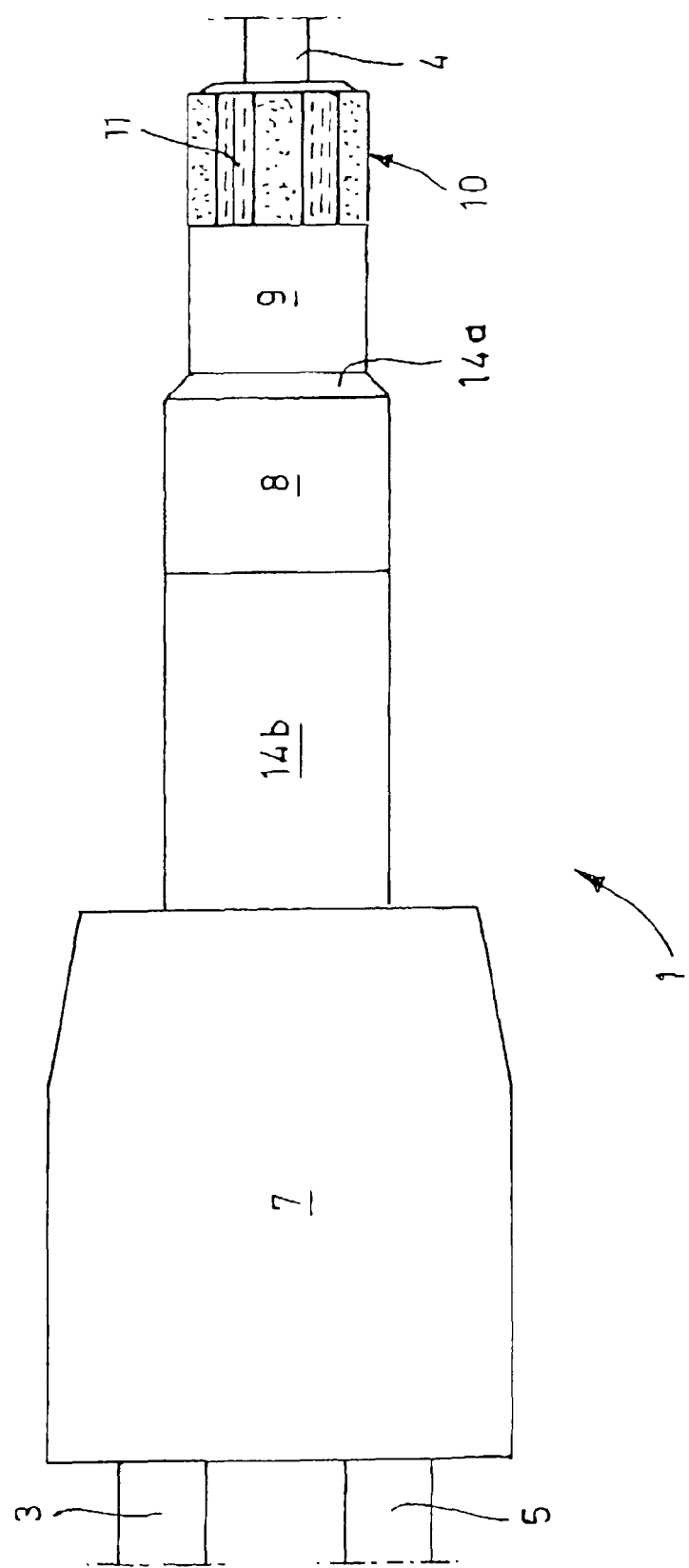

FUEL VAPOR STORAGE AND RECOVERY APPARATUS

CROSS-REFERENCE TO RELATED APPLICATIONS

This application is a continuation application of U.S. Ser. No. 12/431,673, filed Dec. 22, 2008 and claims the benefit of U.S. Provisional Application No. 61/015,664, filed Dec. 20, 2007, the teachings of which are incorporated herein by reference.

FIELD

The present invention relates to a fuel vapor storage and recovery apparatus for the reduction of evaporative emissions from motor vehicles.

BACKGROUND

Fuel vapor storage and recovery apparatuses including a fuel vapor storage canister are well known in the art since years. The gasoline fuel used in many internal combustion engines is quite volatile. Evaporative emissions of fuel vapor from a vehicle having an internal combustion engine occur principally due to venting of fuel tanks of the vehicle. When the vehicle is parked changes in temperature or pressure cause air laden with hydrocarbons escape from the fuel tank. Some of the fuel inevitably evaporates into the air within the tank and thus takes the form of a vapor. If the air emitted from the fuel tank were allowed to flow untreated into the atmosphere it would inevitably carry with it this fuel vapor. There are governmental regulations as to how much fuel vapor may be emitted from the fuel system of a vehicle.

Normally, to prevent fuel vapor loss into the atmosphere the fuel tank of a car is vented through a conduit to a canister containing suitable fuel absorbent materials such as activated carbon. High surface area activated carbon granules are widely used and temporarily absorb the fuel vapor.

A fuel vapor storage and recovery system including a fuel vapor storage canister (so-called carbon canister) has to cope with fuel vapor emissions while the vehicle is shut down for an extended period and when the vehicle is being refueled, and vapor laden air is being displaced from the fuel tank (refueling emissions).

In fuel recovery systems for the European market normally refueling emissions do not play an important role since these refueling emissions are generally not discharged through the carbon canister. However, in integrated fuel vapor storage and recovery systems for the North American market also these refueling emissions are discharged through the carbon canister.

Due to the nature of the absorbent within the carbon canister it is clear that the carbon canister has a restricted filling capacity. It is generally desirable to have a carbon canister with a high carbon working capacity, however, it is also desirable to have a carbon canister with a relatively low volume for design purposes. In order to guarantee always sufficient carbon working capacity of the carbon canister typically under operation of the internal combustion engine a certain negative pressure is applied to the interior of the canister from an intake system of the engine through a fuel vapor outlet port of the carbon canister. With this atmospheric air is let into the canister to the atmospheric air inlet port to pick up the trapped fuel vapors and carry the same to an intake manifold of the intake system of the engine through the fuel vapor outlet port. During this canister purging mode the fuel vapors stored within the carbon canister are burnt in the internal combustion engine.

Although modern fuel vapor storage and recovery systems are quite effective there is still a residual emission of hydrocarbons let into the atmosphere. These so-called "bleed emissions" (diurnal breathing loss/DBL) are driven by diffusion in particular when there are high hydrocarbon concentration gradients between the atmospheric vent port of the carbon canister and the absorbent. Bleed emissions can be remarkably reduced when it is possible to reduce the hydrocarbon concentration gradient. It is quite clear that this can be achieved by increasing the working capacity of the carbon canister.

However, it should also be clear that only a certain percentage of the hydrocarbons stored in the carbon canister can effectively be purged or discharged during the purging mode. This can be an issue for cars where only a limited time for purging is available, for instance in electro hybrid cars where the operation mode of the internal combustion engine is relatively short.

Another issue arises with the use of so-called flexi fuels which comprise a considerable amount of ethanol. Ethanol is a highly volatile fuel which has a comparatively high vapor pressure. For instance, the so-called E10 fuel (10% ethanol) has the highest vapor generation currently in the market. That means that the fuel vapor uptake of the carbon canister from the fuel tank is extremely high. On the other hand, during normal purging modes of a conventional carbon canister only a certain percentage of the fuel vapor uptake may be discharged. As a result the fuel vapor capacity of an ordinary carbon canister is exhausted relatively fast. The bleed emissions of a fully loaded carbon canister normally then increase to an extent which is beyond the emission values given by law.

In order to improve the purge removal rate during the purging mode few vapor storage and recovery devices have been proposed which use so-called purge heaters. By heating the atmospheric air which is led into the canister through the atmospheric air inlet port the efficiency of removing the hydrocarbons trapped in the micropores of the absorbent is enhanced remarkably.

For instance, U.S. Pat. No. 6,230,693 B1 discloses an evaporative emission control system for reducing the amount of fuel vapor emitted from a vehicle by providing an auxiliary canister which operates with a storage canister of the evaporative emission control system. The storage canister contains a first sorbent material and has a vent port in communication therewith. The auxiliary canister comprises an enclosure, first and second passages, a heater and a connector. Inside the enclosure a second sorbent material is in total contact with the heater. During a regenerative phase of operation of the control system the heater can be used to heat the second sorbent material and the passing purge air. This enables the second and first sorbent material to more readily release the fuel vapor they absorbed during the previous storage phase of operation so that they can be burnt during combustion.

Moreover, the storage canister of the evaporative emission control system according to U.S. Pat. No. 6,230,693 comprises two fuel vapor storage compartments side by side connected by a flow passage. In particular the partitioning of the canister actually means a flow restriction. Because the driving pressure of the flow through the canister is very low it is an important design consideration that flow restrictions be kept to a minimum.

SUMMARY

It is an object of the present invention to provide a fuel vapor storage and recovery apparatus including a fuel vapor storage canister which is further improved with regard to the so-called bleed emissions, i.e. which has an improved diurnal breath loss efficiency. It is yet another object to provide a fuel vapor storage and recovery apparatus including a fuel vapor storage canister which has a relatively compact design and low carbon volume, nevertheless having a high working capacity.

These and other objects are achieved by a fuel vapor storage and recovery apparatus including a fuel vapor storage canister, said fuel vapor canister comprising at least first and second vapor storage compartments comprising an absorbent material, at least a vapor inlet port, an atmospheric vent port and a purge port, the fuel vapor storage canister defining an air flow path between said vapor inlet port and said atmospheric vent port and between said atmospheric vent port and said purge port, wherein said first and second vapor storage compartments in flow direction are separated from each other by an air gap diffusion barrier.

In particular by providing an air gap insulation between several vapor storage compartments or several vapor storage beds the hydrocarbon diffusion towards a lower concentration of hydrocarbons, i.e. towards the atmosphere, is significantly slowed down, thus significantly reducing the diurnal breathing losses.

In one embodiment of the fuel vapor storage device according to the invention at least said first and second vapor storage compartments are arranged in concentric relationship.

The term "concentric" in the sense of the present application does not necessarily mean that the fuel vapor storage compartments have a circular cross-section. These compartments may also have a rectangular cross-section. In one embodiment of the invention the fuel vapor storage device may comprise at least some vapor storage compartments which are arranged side by side.

The fuel vapor storage device according to a preferred embodiment of the invention is characterized by a third vapor storage compartment arranged in concentric relationship to said first and second vapor storage compartments. Said third vapor storage compartment may comprise porous monolithic carbon as absorbent. For a person skilled in the art it will be readily apparent that the third vapor storage compartment as well as the first and second vapor storage compartments, may be filled or packed with granular activated coal.

In a preferred embodiment of the fuel vapor storage device according to the invention the vapor storage compartments are integrated in a common canister housing, thus fulfilling the need for a compact design having little space requirements.

Each vapor storage compartment may have a circular cross-sectional area, the cross-sectional area of the downstream compartment, whiled regarding an air flow from the atmospheric vent port towards the purge port, being preferably larger than the cross-sectional area of the upstream vapor storage compartment, in order to eliminate dead zones in the vapor storage beds. Due to this design of the vapor storage compartments the purging gas may effectively flow through the entire carbon bed, thus improving the purge removal rate during the purge mode which also leads to a significant reduction of bleed emissions.

In this respect it is advantageous when the cross-sectional area of each vapor storage compartment at its downstream end, while regarding an air flow from the atmospheric vent port towards the purge port, is larger or equal to its cross-sectional area at its upstream end.

In one embodiment of the fuel vapor storage device according to the invention at least one flow diverter is provided, the flow diverter defining an extended air gap diffusion barrier. Due to the presence of such flow diverter the length of the air path of the diffusion barrier is multiplied, i.e. at least doubled.

The flow diverter may be in the form of a cup-shaped insert at least partially surrounding one vapor storage bed within one vapor storage compartment.

In one embodiment the fuel vapor storage device according to the invention comprises a purge heater which is activated during purging which leads to a significant improvement of the purge removal rate during operation of the internal combustion engine.

The purge heater may be located in the purge heater compartment directly communicating with said purge port.

It should be appreciated that advantageously the purge heater compartment is located at the upstream end of the airflow during the purging cycle, however, alternatively the purge heater compartment may be located in any one of the fuel storage beds.

In order to enhance the heat transfer from the purge heater into the carbon bed it is advantageous when the purge heater compartment is at least concentrically surrounded by a vapor storage bed in a non-insulated fashion, thus allowing heat radiation into the surrounding vapor storage bed. As is mentioned in the very beginning of the present application a higher temperature enables complete purging of hydrocarbons from the carbon bed and thus increases the capacity of the volume to prevent fuel vapor breakthrough during a fuel vapor storage cycle. In this context it should be mentioned that an equal temperature distribution through the carbon bed improves the purging results remarkably.

By "non-insulated" is meant that the purge heater or purge heater elements are not in direct contact with the carbon bed, however, the purge heater is not shielded against the surrounding carbon bed. The purge heater compartment can, for instance, comprise a cage-like structure allowing heat radiation into the surrounding carbon bed.

The purge heater may comprise one or more electric heating elements which are connected to the source of electric energy, such as for instance the battery of the car.

The purge heater may, for instance, comprise electrically conductive ceramic as heating elements.

Alternatively, the purge heater may comprise electrically conductive carbon, preferably porous monolithic carbon. Such porous monolithic carbon is, for instance, disclosed in US 2007-0056954 A1. These monolithic carbon heating elements have a channel structure allowing air flow through the heating elements and thus allowing an enhanced heat transfer directly through the purging air sucked from the atmosphere.

BRIEF DESCRIPTION OF THE DRAWINGS

The invention will hereinafter be described by way of example with reference to the accompanying drawings, in which:

FIG. 1 shows a cross-sectional view through a carbon canister according to the invention and FIG. 2 shows an exploded diagrammatic view of the compartments of the carbon canister.

DETAILED DESCRIPTION

Figure 1:
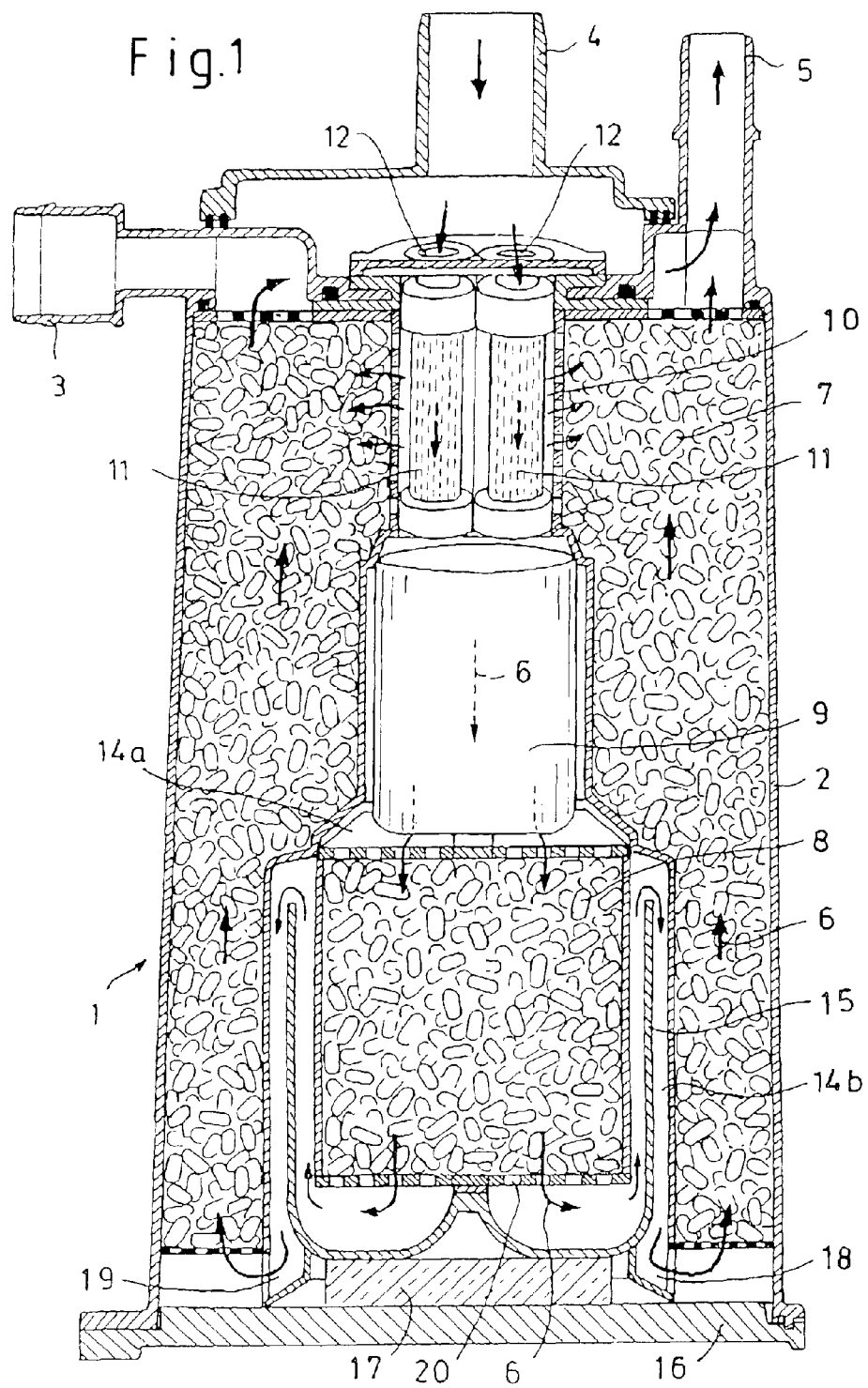

A fuel vapor storage and recovery apparatus 1 is illustrated in FIG. 1. The illustration is schematic and the components are not drawn to scale.

The fuel vapor storage and recovery apparatus 1 comprises a vapor inlet port 3 connected to a fuel tank (not shown), a vent port 4 communicating with the atmosphere and a purge port 5 connected to an internal combustion engine of a motor vehicle (also not shown). The carbon canister 2 is packed with an adsorbent in the form of granulated activated carbon.

During shut-off the engine of the motor vehicle the carbon canister 2 is connected via vapor inlet port 3 to the fuel tank of the motor vehicle and via vent port 4 to the atmosphere.

As explained in the very beginning of this application, during shut-off of the car the fuel within the fuel tank evaporates into the air space above the maximum filling level of the fuel tank. This vapor laden air flows via vapor inlet port 3 into the carbon canister 2. During refueling of the car, where normally the internal combustion engine is also shut off, in integrated systems the fuel being pumped into the fuel tank causes an air flow through the vapor inlet port 3 the flow rate of which corresponds to the flow rate of refueling. Accordingly, hydrocarbon laden air is pumped with a flow rate of up to 60 l/min into the carbon bed of the carbon canister. The activated carbons within the carbon canister absorb the hydrocarbons, hydrocarbon molecules being trapped within the internal pore structure of the carbon. More or less cleaned air will be discharged from the vent port 4.

During engine running cycles of the car a flow path between the vent port 4 and the purge port 5 will be established. The internal combustion engine sucks a certain amount of air to be burnt within the cylinders of the internal combustion engine from the atmosphere via vent port 4 through the carbon canister 2 into the purge port 5, thereby purging the absorbent of the carbon canister 2.

In the drawings arrows 6 indicate the air flow during purging of the carbon canister. The terms "downstream" and "upstream" hereinafter always refer to the airflow during purging of the carbon canister 2.

The carbon canister 2 comprises first 7, second 8 and third 9 vapor storage compartments. The first vapor storage compartment 7 is with regard to the airflow during upload of hydrocarbons to the carbon canister 2 the vapor storage compartment next to the vapor inlet port 3 and is also the biggest vapor storage compartment.

It will be readily apparent from FIG. 1 that the vapor storage compartment 7, 8, 9 have a circular cross-sectional area and are arranged in concentric relationship to each other. The first vapor storage compartment 7 surrounds the vapor storage compartments 8 and 9. Next to the vent port 4 at the upstream side of the third vapor storage compartment 9 there is arranged a purge heater compartment 10 which has also a cylindrical shape, i.e. a circular cross-section. The purge heater compartment 10 encloses four electric heating elements 11 which are electrically connected in series with a source of electric energy, for instance through the battery of the vehicle. It is to be understood that any electric heating element is suitable for this purpose. The heating element could for instance be a PTC thirmistor, an NTC thirmistor or for example an electrically conductive carbon heating element.

The heating elements may be of cylindrical shape and comprise an electrically conductive porous carbon monolith, such as for instance, a synthetic carbon monolith generally disclosed in US 2007-0056954 A1. Each heating element 11 provides continuous longitudinal channels (not shown) allowing an airflow in longitudinal direction through each heating element. The heating elements 11 are only activated during the purging operation of the fuel vapor storage and recovery apparatus 1.

The purge heater compartment 10 has at its upstream face two inlet openings 12 allowing atmospheric air to be drawn into the purge heater compartment 10. The purge heater compartment 10 has a relatively thin-walled surrounding wall 13 which is designed such that heat radiation from the resistive heating element 11 may be transferred into the surrounding carbon bed of the first vapor storage compartment 7.

However, in the first place the heating elements 11 directly transfer heat to the atmospheric air drawn into the purge heater compartment 10. At its downstream end the purge heater compartment 11 is in alignment with the third vapor storage compartment 9, whereas the third vapor storage compartment 9 is at its downstream end in alignment with the second vapor storage compartment 8, the purge heater compartment 11 and the third and second vapor storage compartments 9 and 8 being concentrically surrounded by the first vapor storage compartment 7.

It should be noted that first and second vapor storage compartments 7 and 8 are packed or stuffed with activated carbon in granular form, whereas the third vapor storage compartment 9 may contain a monolithic porous carbon element.

Between the third vapor storage compartment 9 and the second vapor storage compartment 8, as well as between the second vapor storage compartment 8 and the first vapor storage compartment 7 first and second air gaps 14a and 14b as diffusion barriers are provided.

The air gap 14a forming the transition from the third vapor storage compartment 9 to the second vapor storage compartment 8 is according to the differences in diameter of the third vapor storage compartment 9 and the second vapor storage compartment 8 funnel shaped. The first vapor storage compartment 3 has over its entire length a constant diameter which is smaller than the diameter of the second vapor storage compartment 8. Also the second vapor storage compartment 8 has over its entire length a constant diameter.

The carbon bed within the second vapor storage compartment 8 is partly enclosed and held by a cup-shaped insert 15 which defines a U-turn flow path for the purging air as is indicated by the arrows in FIG. 1. Due to this design the air path length amounts to double the length of the second vapor storage compartment 8. The insert 15 functions as an airflow diverter for the purging air.

The dimensions of compartments of the carbon canister 2 can best be taken from the exploded view of FIG. 2.

Again, with reference to FIG. 1 it can be seen that between a bottom lid 16 of the carbon canister 2 and the insert 15 an insulation element 17 is provided.

Moreover, at the downstream end of the air gap 14 a ring shaped channel 18 defines the transition into the first vapor storage compartment 7. In this ring shaped channel 18 flow openings 19 are provided which are designed such that the air flow of purge air is directed readily into the upstream end of the first vapor storage compartment 7.

During running cycles of the internal combustion engine of the vehicle the fuel vapor storage and recovery apparatus 1 according to the invention is set to purge mode. Atmospheric air is drawn from the internal combustion engine of the vehicle from the vent port 4 via inlet opening 12 into the purge heater compartment 10. The heating elements 11 are electrically connected to the battery of the vehicle during purging. The air flows through and around the heating elements 11 thereby being heated up to a temperature below 150° C. At the same time radiation heat emitted by the heating elements 11 heats up the surrounding carbon bed of the first vapor storage compartment 7. Heated air flows through the third vapor storage compartment 9, the air gap 14a into the second vapor storage compartment 8 through a bottom grid 20 at the downstream end of the carbon bed within vapor storage compartment 8 and is then diverted into upward direction by the cup-shaped insert 15 in the extended and elongated air gap 14b. On its way the atmospheric air will be loaded by the hydrocarbons stored in the carbon beds. This air flow, as indicated by the arrows in FIG. 1 within the extended air gap 14b makes a U-turn and at the very end of the air gap 14b flows into and through the carbon bed of the first vapor storage compartment 7 and is finally drawn through the purge port 5 to a purging line leading to the internal combustion engine.

During shut-off of the internal combustion engine the fuel vapor emissions entering the carbon canister through the vapor inlet port 3 will be directed into the other direction towards the vent port 4, the air gaps 14a and 14b thereby providing an effective diffusion barrier and thus reducing effectively the bleed emissions.

REFERENCE NUMBERS

1 Fuel vapor storage and recovery apparatus
2 Carbon canister
3 Vapor inlet port
4 Vent port
5 Purge port
6 Arrows
7 First vapor storage compartment
8 Second vapor storage compartment
9 Third vapor storage compartment
10 Purge heater compartment
11 Heating elements
12 Inlet openings
13 Wall
14a,b Air gaps
15 Insert
16 Bottom lid
17 Insulation element
18 Ring-shaped channel
19 Flow openings
20 Bottom grid

What is claimed is:

1. A fuel vapor storage and recovery apparatus including a fuel vapor storage canister, said fuel vapor storage canister comprising;
a plurality of vapor storage compartments, wherein the plurality of vapor storage compartments provide all the vapor storage compartments of the apparatus;
the plurality of vapor storage compartments comprising first and second vapor storage compartments, said first and second vapor storage compartments filled with an absorbent material to form a vapor storage bed;
at least one vapor inlet port connected to a fuel tank;
an atmospheric vent port and a purge port;
said fuel vapor storage canister defining an air flow path between said at least one vapor inlet port and said atmospheric vent port and between said atmospheric vent port and said purge port;
said first storage compartment being closer in proximity to the vapor inlet port than said second storage compartment and the first compartment to receive vapor from said fuel tank;
wherein said first and second vapor storage compartments in flow direction are separated from each other by an air gap diffusion barrier; and
wherein all the vapor storage compartments of the apparatus are arranged in concentric relationship to each other.

2. The fuel vapor storage apparatus according to claim 1, wherein all the vapor storage compartments are integrated in a common canister housing.

3. The fuel vapor storage apparatus according to claim 1, wherein each vapor storage compartment includes a downstream compartment and an upstream compartment each having a cross-sectional area, the cross-sectional area of the downstream compartment, while regarding an air flow from the atmospheric vent port towards the purge port, being larger than the cross-sectional area of the upstream vapor storage compartments.

4. The fuel vapor storage apparatus according to claim 1, wherein each vapor storage compartment includes a downstream end and an upstream end wherein the cross-sectional area of each vapor storage compartment at its downstream end, while regarding an air flow from the atmospheric vent port towards the purge port, is larger or equal to the cross-sectional area at its upstream end.

5. The fuel vapor storage apparatus according to claim 1, wherein at least one flow-diverter defines an extended air gap diffusion barrier.

6. The fuel vapor storage apparatus according to claim 5, wherein the at least one flow-diverter is in the form of a cup-shaped insert at least partially surrounding one vapor storage bed.

7. The fuel vapor storage apparatus according to claim 1, wherein said apparatus further comprises a purge heater which is activated during purging.

8. The fuel vapor storage apparatus according to claim 7, wherein the purge heater is located in a purge heater compartment directly communicating with said purge port.

9. The fuel vapor storage apparatus according to claim 7, wherein the purge heater compartment is at least concentrically surrounded by one of the vapor storage beds in a non-insulated fashion, thus allowing heat radiation into the surrounding vapor storage bed.

10. The fuel vapor storage apparatus according to claim 7, wherein the purge heater comprises one or more electric heating elements which are connected to a source of electric energy.

11. The fuel vapor storage apparatus according to claim 7, wherein the purge heater comprises electrically conductive ceramic as heating elements.

12. The fuel vapor storage apparatus according to claim 7, wherein the purge heater comprises electrically conductive carbon.

13. The fuel vapor storage apparatus according to claim 12, wherein the electrically conductive carbon is porous monolithic carbon.

14. The fuel vapor storage apparatus according to claim 7, wherein the purge heater comprises a positive temperature coefficient thirmistor.

15. The fuel vapor storage apparatus according to claim 1, wherein the air gap diffusion barrier surrounds the second vapor storage compartment and has a flow length which is longer than a length of the second vapor storage compartment.

16. The fuel vapor storage apparatus according to claim 1, wherein the air gap diffusion barrier surrounds the second vapor storage compartment and has a flow length which is at least double a length of the second vapor storage compartment.

17. The fuel vapor storage apparatus according to claim 1, wherein said apparatus further comprises a third vapor storage compartment and wherein said second and third vapor storage compartments are positioned within said first vapor storage compartment.

18. A fuel vapor storage and recovery apparatus including a fuel vapor storage canister, said fuel vapor storage canister comprising;
first and second vapor storage compartments, said first and second vapor storage compartments filled with an absorbent material to form a vapor storage bed;

at least one vapor inlet port connected to a fuel tank;

an atmospheric vent port and a purge port;

said fuel vapor storage canister defining an air flow path between said at least one vapor inlet port and said atmospheric vent port and between said atmospheric vent port and said purge port;

said first storage compartment being closer in proximity to the vapor inlet port than said second storage compartment and the first compartment to receive vapor from said fuel tank;

wherein said first and second vapor storage compartments in flow direction are separated from each other by an air gap diffusion barrier and wherein said first and second vapor storage compartments are arranged in concentric relationship;

wherein said apparatus further comprises a purge heater which is activated during purging;

wherein the purge heater is located in a purge heater compartment directly communicating with said purge port; and wherein the purge heater compartment is at least concentrically surrounded by one of the vapor storage beds in a non-insulated fashion, thus allowing heat radiation into the surrounding vapor storage bed.

* * * * *

UNITED STATES PATENT AND TRADEMARK OFFICE
CERTIFICATE OF CORRECTION

PATENT NO. : 8,297,262 B2  
APPLICATION NO. : 12/964107  
DATED : October 30, 2012  
INVENTOR(S) : Tobias Lang et al.

Page 1 of 1

It is certified that error appears in the above-identified patent and that said Letters Patent is hereby corrected as shown below:

On title page, item (75), in "Inventors", in column 1, line 4, delete "Southhampton (GB)" and insert -- Southampton (GB) --, therefor.

On title page, item (63), under "Related U.S. Application Data", in column 1, line 1-2, delete "Continuation of application No. 12/431,673, filed on Apr. 28, 2009, now Pat. No. 8,190,111." and insert -- Continuation of application No. 12/341,673, filed on Dec. 22, 2008, now Pat. No. 7,900,607. --, therefor.

In column 1, line 8, delete "12/431,673," and insert -- 12/341,673, --, therefor.

In column 8, line 46, in claim 14, delete "thirmistor." and insert -- thermistor. --, therefor.

Signed and Sealed this  
Twenty-sixth Day of March, 2013

Teresa Stanek Rea  
*Acting Director of the United States Patent and Trademark Office*